(12) United States Patent
Geisen

(10) Patent No.: US 12,162,090 B2
(45) Date of Patent: Dec. 10, 2024

(54) METHOD FOR SELECTIVELY IRRADIATING A MATERIAL LAYER, METHOD FOR PROVIDING A DATA SET, DEVICE AND COMPUTER PROGRAM PRODUCT

(71) Applicant: Siemens Energy Global GmbH & Co. KG, Munich (DE)

(72) Inventor: Ole Geisen, Berlin (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 1008 days.

(21) Appl. No.: 16/961,733

(22) PCT Filed: Feb. 6, 2019

(86) PCT No.: PCT/EP2019/052850
§ 371 (c)(1),
(2) Date: Jul. 13, 2020

(87) PCT Pub. No.: WO2019/179690
PCT Pub. Date: Sep. 26, 2019

(65) Prior Publication Data
US 2021/0053119 A1 Feb. 25, 2021

(30) Foreign Application Priority Data
Mar. 20, 2018 (EP) ..................... 18162870

(51) Int. Cl.
*B23K 26/0622* (2014.01)
*B22F 10/00* (2021.01)
(Continued)

(52) U.S. Cl.
CPC .......... *B23K 26/0622* (2015.10); *B22F 10/00* (2021.01); *B22F 10/36* (2021.01);
(Continued)

(58) Field of Classification Search
CPC ............ B23K 26/0622; B23K 26/0608; B23K 26/342; B23K 26/082; B23K 2101/001;
(Continued)

(56) References Cited

U.S. PATENT DOCUMENTS

| 4,638,145 A * | 1/1987 | Sakuma ............. B23K 26/0853 219/121.61 |
| 2008/0035611 A1* | 2/2008 | Kuno ................... C03B 33/0222 219/69.1 |

(Continued)

FOREIGN PATENT DOCUMENTS

| CN | 104010749 A | 8/2014 |
| CN | 105163929 A | 12/2015 |

(Continued)

OTHER PUBLICATIONS

PCT International Search Report and Written Opinion of International Searching Authority mailed Apr. 8, 2020 corresponding to PCT International Application No. PCT/EP2019/052850 filed Feb. 6, 2019.

*Primary Examiner* — Thomas C Lee
*Assistant Examiner* — Tyler Dean Hedrick

(57) ABSTRACT

A method for selectively irradiating a material layer in additive production. The method includes: providing geometry data having geometry information of individual layers of a component that is to be produced by additive means, and defining an irradiation pattern for the layers by a computer-supported production method, wherein the irradiation pattern has a contour and a surface region in layers, wherein first contour vectors of the contour are specified for continuous irradiation operation and second contour vectors of the contour are specified for pulsed irradiation operation. A method for providing a data set, an additive production method, a corresponding device and a corresponding com- (Continued)

puter program product selectively irradiate a material layer in additive production.

14 Claims, 4 Drawing Sheets

(51) Int. Cl.

| | | |
|---|---|---|
| *B22F 10/28* | (2021.01) | |
| *B22F 10/36* | (2021.01) | |
| *B22F 10/366* | (2021.01) | |
| *B22F 10/38* | (2021.01) | |
| *B22F 12/43* | (2021.01) | |
| *B23K 26/06* | (2014.01) | |
| *B23K 26/342* | (2014.01) | |
| *B33Y 10/00* | (2015.01) | |
| *B33Y 30/00* | (2015.01) | |
| *B33Y 50/00* | (2015.01) | |
| *B22F 10/25* | (2021.01) | |
| *B23K 26/082* | (2014.01) | |
| *B23K 101/00* | (2006.01) | |
| *B23K 103/08* | (2006.01) | |

(52) U.S. Cl.
CPC ........ *B22F 10/366* (2021.01); *B23K 26/0608* (2013.01); *B23K 26/342* (2015.10); *B33Y 10/00* (2014.12); *B33Y 30/00* (2014.12); *B33Y 50/00* (2014.12); *B22F 10/25* (2021.01); *B22F 10/28* (2021.01); *B22F 10/385* (2021.01); *B22F 12/43* (2021.01); *B23K 26/082* (2015.10); *B23K 2101/001* (2018.08); *B23K 2103/08* (2018.08)

(58) Field of Classification Search
CPC ...... B23K 2103/08; B22F 10/00; B22F 10/36; B22F 10/366; B22F 10/25; B22F 10/28; B22F 10/385; B22F 12/43; B22F 12/45; B33Y 10/00; B33Y 30/00; B33Y 50/00; G06F 30/00; Y02P 10/25; B29C 64/153; B29C 64/386
See application file for complete search history.

(56) References Cited

U.S. PATENT DOCUMENTS

| | | | |
|---|---|---|---|
| 2008/0212455 A1* | 9/2008 | Hoeven | ................. G11B 7/126 |
| 2014/0348692 A1 | 11/2014 | Bessac et al. | |
| 2016/0052087 A1 | 2/2016 | O'Neill | |
| 2016/0074937 A1* | 3/2016 | Nassar | ................. B29C 64/153 |
| | | | 419/53 |
| 2016/0186575 A1* | 6/2016 | Lacy | ...................... F01D 25/12 |
| | | | 29/889.22 |
| 2016/0250715 A1 | 9/2016 | Burbaum et al. | |
| 2018/0050423 A1 | 2/2018 | Hoferer | |
| 2019/0047050 A1* | 2/2019 | Zhang | ..................... B22F 12/90 |
| 2020/0189143 A1* | 6/2020 | Brandt | ................. C04B 35/653 |
| 2020/0238566 A1* | 7/2020 | Lin | ......................... B22F 10/28 |

FOREIGN PATENT DOCUMENTS

| | | |
|---|---|---|
| CN | 105705291 A | 6/2016 |
| CN | 107405688 A | 11/2017 |
| CN | 107790717 A | 3/2018 |
| EP | 2424706 A1 | 3/2012 |
| EP | 2868422 A1 | 5/2015 |
| EP | 3037246 A2 | 6/2016 |
| EP | 2424706 B1 | 1/2018 |
| WO | 20100125371 A1 | 11/2010 |
| WO | 2011050790 A2 | 5/2011 |

\* cited by examiner

METHOD FOR SELECTIVELY IRRADIATING A MATERIAL LAYER, METHOD FOR PROVIDING A DATA SET, DEVICE AND COMPUTER PROGRAM PRODUCT

CROSS REFERENCE TO RELATED APPLICATIONS

This application is the US National Stage of International Application No. PCT/EP2019/052850 filed 6 Feb. 2019, and claims the benefit thereof. The International Application claims the benefit of European Application No. EP18162870 filed 20 Mar. 2018. All of the applications are incorporated by reference herein in their entirety.

FIELD OF INVENTION

The present invention relates to a method for selectively irradiating a material layer, to a method for providing a data set, to an additive production method, to a device for selectively irradiating a material layer in additive production, and to a corresponding additive production method and a computer program product.

BACKGROUND OF INVENTION

Additive methods for the production or maintenance, or service or repair, of components comprise, for example as powder bed methods, selective laser melting (SLM) or laser sintering (SLS), or electron beam melting (EBM). Additive methods likewise include laser deposition welding (LMD).

Additive manufacturing methods have proven particularly advantageous for complex or complicatedly or filigree-designed components, for example labyrinth-like structures, cooling structures and/or lightweight structures. In particular, additive manufacture is advantageous because of a particularly short chain of process steps, since a step of production or manufacture of a component can be carried out on the basis of a geometrical data set, for example of a corresponding CAD file.

The present disclosure advantageously relates to components which are intended for use in a turbomachine, advantageously in the hot-gas path of a gas turbine. The component advantageously consists of a superalloy, in particular a nickel-based or cobalt-based superalloy. The alloy may be precipitation-hardened or precipitation-hardenable.

A method for producing components from a powder-form base material by means of a laser beam in pulsed operation is known, for example, from EP 2 424 706 B1.

Despite the ever-growing relevance of additive production processes for many industrial sectors and a large number of developments which have been aimed at the industrialization of additive processes, there are difficulties in controlling an energy input of the corresponding energy beam used for the solidification of the component layer to the benefit of the desired component structure. Particularly in the case of filigree geometries or overhanging regions of the components to be produced, which are precisely the ones that make additive processes suitable for production, there is the difficulty of controlling the irradiation parameters and also of selecting a correspondingly suitable irradiation strategy. The construction of these filigree regions is further complicated by the input of heat, or the difficulty of avoiding overheating in locally very limited regions to be solidified.

Even with predetermined parameters for the irradiation of a component region to be solidified, the irradiation vectors or irradiation paths, which are selected for the solidification of a powder layer from the powder bed, are subject for example to variations in width, which may lead to irregularities in the molten pool and therefore to a nonuniform surface and deficient surface quality.

SUMMARY OF INVENTION

It is therefore an object of the present invention to provide means which help to improve the irradiation of a powder layer, in such a way that results in optimal structural properties of the components respectively to be produced as a function of the geometry and/or the selected material. The improvements relate, in particular, to the irradiation of a material layer in additive production for selective powder bed-based processes such as selective laser melting (or laser sintering) and/or electron beam melting.

This object is achieved by the subject matter of the independent patent claims. The dependent patent claims relate to advantageous configurations.

One aspect of the present invention relates to a method for selectively irradiating a material layer in additive production, comprising providing geometrical data, advantageously containing information of a predetermined component geometry, comprising geometrical information of individual layers of the component to be produced. The geometrical data may for example be provided, i.e. uploaded or generated or otherwise read in, in a geometrical data set.

The method furthermore comprises defining an irradiation pattern for the layers of the component by means of a computer-aided manufacturing method, in particular a CAM method, the irradiation pattern layerwise comprising a contour, or a contour region, and a surface region, for example lying inside the contour, first contour vectors of the contour for continuous irradiation operation and second contour vectors—different to the first contour vectors—of the contour for pulsed or time-modulated irradiation operation being established, transferred or stored.

A "contour vector" may in particular denote an irradiation path at the edge of a component layer, for example as seen in a top view of the powder bed, which defines an inner or alternatively an outer edge of the component.

By the combination of continuous and pulsed or modulated irradiation, for example of its powder bed, for the additive production of a component contour by an energy beam, for example a laser beam or electron beam, it is possible in particular to achieve improved surface properties and/or structural properties in edge regions of the component, problem zones or "hot spots", i.e. regions which are particularly susceptible to local overheating during production.

It is to be understood that such a selection of irradiation parameters and/or geometries in additive production layerwise can scarcely be carried out manually, but needs to be carried out with computer aid by means of CAM, so that the production can take place adequately and economically.

For example, in the course of the preparation for the actual additive production of a powder layer, which is for example intended to be selectively irradiated with a laser for the production of the component, an inner-lying region or surface region may initially be selected, which is then irradiated with an energy beam and solidified. Subsequently, a contour region, which may laterally enclose the surface region, is conventionally selected. This contour region is expediently irradiated after the surface region during the subsequent actual production. In this way, in particular, structural run-offs or inaccuracies of the surface region may be compensated for or smoothed.

According to the present invention, the contour irradiation, or the corresponding establishment or definition of the irradiation parameters, now comprises continuous and modulated irradiation operation, the modulated contour now possibly no longer being able to bring about this said smoothing effect. The selected modulated contour, or contour irradiated in pulsed operation, over which the contour of the component layer may then be melted again during production, may however further reduce the surface roughness and significantly improve the construction or solidification outcome, for example leading to an improved dimensional accuracy of the correspondingly constructed region.

The actual definition of the irradiation pattern is advantageously carried out by means of calculation and/or simulation or predefined according to an algorithm.

In the actual additive production, the irradiation according to the second contour vectors is then carried out (advantageously after the irradiation according to the first contour vectors) independently of the order in which the first and second contour vectors of the irradiation pattern are defined or established.

In one configuration, the first contour vectors (continuous irradiation operation) overlap with the second contour vectors (pulsed irradiation operation) at least partially (cf. exemplary embodiment below).

In one configuration, the first contour vectors overlap fully with the second contour vectors.

In one configuration, there is no overlap between the first contour vectors and the second contour vectors.

In one configuration, the contour regions comprise for example thin walls, overhangs or inner-lying structures or features of the component having a defined or predetermined surface quality or structural quality and/or dimensional tolerance. In other words, the contour regions are advantageously regions of the component which are particularly difficult to produce and which need to be treated with a different irradiation strategy in comparison with inner regions or surface regions of the component, in order to achieve sufficient material properties and a sufficient dimensional accuracy.

In one configuration, the irradiation pattern is defined as a function of an overhang angle of individual cross-sectional regions of the component.

A "cross-sectional region" is advantageously a region of the component which is exposed according to its layer subdivision during production, or which predefines the layer subdivision. Thus, according to the present invention, the irradiation parameters are advantageously correspondingly adjusted and/or proposed by a data processing device or a computer depending on whether an overhanging component contour (so-called "upskin" vector) or, for example, a perpendicular component contour directed vertically upward is involved.

In one configuration, further irradiation parameters such as vector length, pulse length, scan and/or irradiation speed, laser power, track or strip distance (so-called "hatch" distance), strip width and/or further parameters are established for the definition of the irradiation pattern.

In one configuration, a vector length of the first and/or second contour vectors of the contour has a length of between 50 and 200 µm, advantageously between 100 and 150 µm.

In one configuration, the irradiation parameters comprise a scan or irradiation speed of less than 200 mm/s.

In one configuration, the second irradiation vectors (during the actual additive production) generate—in comparison with the first irradiation vectors of the contour—a smaller molten pool, which has the effect that the surface quality or structural quality of the correspondingly irradiated region can be improved.

In one configuration, a beam offset of neighboring (first or second) irradiation vectors of the contour is established, defined or adjusted between 40 and 100 µm.

A further aspect of the present invention relates to a method for providing a data set for the selective irradiation of the material layer in additive production, as described above. The method furthermore comprises linking, superimposing, marking or transferring irradiation parameters at least of the second contour vectors with the geometrical data in a common data set. In other words, the data set advantageously contains information about "where and how" regions for the component are irradiated.

Correspondingly, the data set may describe a data structure product and/or advantageously comprise functional data, as well as syntactic and also semantic information. The data set is advantageously a product or result of the above-described method for selectively irradiating the material layer and inherently contains the technical information which—when forwarded to an additive manufacturing system—leads to the advantages according to the invention.

The provision of the data may, for example, be carried out by uploading or downloading, reading in a file, generating a file or, for example, by exchanging data in a "peer-to-peer" network, or in a similar way.

In one configuration, the data set additionally contains material information of the component, or of a starting material therefor, which is advantageously likewise "linked" in the data set.

A further aspect of the present invention relates to a computer program product comprising instructions which, when the program is executed by a computer or a data processing device, cause the latter to carry out the layerwise establishment of the irradiation pattern as described above and/or the linking of the irradiation parameters of the second contour vectors with the geometrical data.

A further aspect of the present invention relates to a device for selectively irradiating the material layer in additive production, which is suitable for carrying out a selective irradiation method as described above, furthermore comprising an energy beam source for selectively irradiating the material layer, wherein the device is furthermore advantageously configured to allow continuous as well as pulsed or modulated irradiation operation. Accordingly, the device may for example comprise an energy beam source and/or correspondingly configured optics or a corresponding modulator.

In one configuration, the device comprises a pulse generator for the above-described pulsed irradiation operation.

In one configuration, the energy beam source is a first energy beam source for continuous irradiation operation of the contour.

In one configuration, the device comprises at least one second energy beam source, advantageously a laser, for pulsed irradiation operation of the contour.

A further aspect of the present invention relates to an additive production method comprising the selective irradiation method as described above, wherein the selective irradiation is carried out by means of a laser or an electron beam, and wherein the material layer is a powder layer.

In one configuration, the powder layer consists of an in particular hardened nickel-based or cobalt-based superalloy.

In one configuration, the component is a component which is to be used, or which is provided, in the hot-gas path of a turbomachine, or is a corresponding component part.

A further aspect of the present invention relates to a component which is produced or producible according to the additive production method as described above, furthermore comprising—in comparison with a component produced according to the prior art—a surface quality or structural quality and/or dimensional accuracy improved by 50 to 100%.

Configurations, features and/or advantages which relate here to the selective irradiation method, to the method for providing the data set, or to the computer program product, may furthermore relate to the device, to the additive production method and/or to the component, or vice versa.

BRIEF DESCRIPTION OF THE DRAWINGS

Further details of the invention will be described below with the aid of the figures.

DETAILED DESCRIPTION OF INVENTION

In the exemplary embodiments and figures, elements which are the same or have the same effect may respectively be provided with the same references. The elements represented and their size proportions with respect to one another are not in principle to be regarded as true to scale; rather, individual elements may be represented exaggeratedly thick or largely dimensioned for better representability and/or for better understanding.

Figure 1:
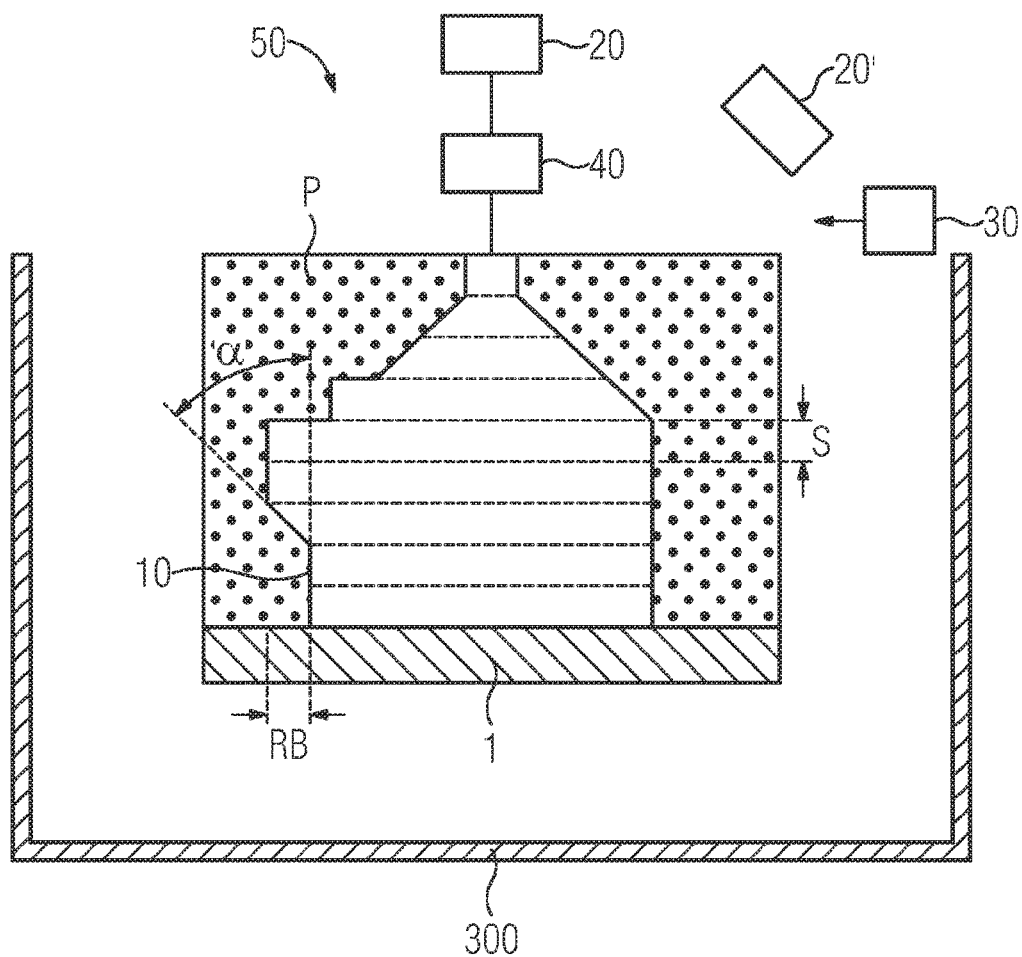
FIG. 1 shows a schematic sectional view of an additive production system and of a component produced therein.

FIG. 1 shows an additive production system 300 for producing a component 10. The production system 300 may (colloquially) denote a "3D printer". Advantageously, the production system 300 denotes a system for selective laser melting and/or electron beam melting ("powder bed fusion").

The production system 300 comprises a construction platform 1. A component 10 is shown during its additive production on the construction platform 1. The component 10 is arranged in a powder bed P, some regions (cross-sectional regions or individual layers S of the component 10 are indicated with the aid of the dashed horizontal lines) having already been selectively solidified by an energy beam source 20, advantageously by exposure or irradiation by an energy beam, advantageously a laser beam or an electron beam (not explicitly denoted). The energy beam source 20 is advantageously a first energy beam source.

The component 10 is advantageously a component which is used in the hot-gas path of a turbomachine, for example of a gas turbine. In particular, the component may denote a rotor blade or guide vane, a segment or ring segment, a burner part or a burner tip, a frame, a shield, a nozzle, seal, a filter, an opening or lance, a resonator, prop or a turbulator, or a corresponding junction, insert, or a corresponding retrofit part.

The production system 300 advantageously comprises a device 50. The device 50 is advantageously a device according to the invention, comprising an irradiation device, in turn comprising the first energy beam source 20. The first energy beam source is advantageously configured for the irradiation of a material layer of the component or for the component 10 according to continuous irradiation operation (continuous-wave operation).

The additive production of the component 10 from the powder bed comprises, for example, after the selective irradiation of a layer region for solidification, lowering of the construction platform 1 advantageously by an extent corresponding to a layer thickness S, and application of a further powder layer by means of a coater 30.

It may be seen in FIG. 1 that the component 10 (despite its schematic representation) comprises an overhanging edge region RB on the side represented on the left. For the production of the component 10, the edge region RB advantageously requires irradiation with irradiation parameters that differ from those parameters according to which, for example, an inner surface, or a region which is less critical in terms of overheating, of the component 10 needs to be irradiated (see below). The surface regions may, for example, be irradiated with a larger beam offset for improved process efficiency and at the cost of the structural resolution.

Unlike as represented in FIG. 1, the edge region may be a circumferential edge region of the component 10.

In particular, because of its overhang (cf. overhang angle $\alpha$), the edge region RB is particularly susceptible to structural defects during production, such as a defective melting outcome or overheating during production, since heat may be dissipated substantially more slowly below the overhang through the quasi thermally insulating powder bed P than is the case through the previously constructed structure of the component 10.

Advantageously, an inner region or surface region FB of the component 10 is irradiated first for its production. Subsequently, a contour is advantageously "tracked" with modified irradiation parameters in order to smooth run-offs of the solidified material. The contour may in the present case comprise the aforementioned edge region RB of the component 10 (likewise cf. FIG. 3 below).

According to the present invention, the contour (cf. reference K in the figures described below) is now initially irradiated continuously, that is to say according to the first (continuous) contour vectors KV1. This region is subsequently irradiated with second (pulsed or modulated) contour vectors KV2 (see below), which crucially improves the solidification outcome particularly in regions RB of the component 10 which are susceptible to structural defects, since the input of energy into the material can be dosed very much better by the pulsing or modulation of the energy beam, for example by an (ultra)short pulsed laser, and can be adjusted according to the individual geometry and the selected component material.

Thus, for example, the production of the edge region RB or the contour K of the component 10 requires—in contrast to other regions—reduction of the radiation power into the material. Otherwise, very fine component regions (cf. KV2 in FIG. 3) would for example be thermally deformed and/or susceptible to hot cracks or distortions, which would make the entire component 10 unusable and, in the case of strong distortions, could even damage the production system 300 or the coater 30.

In other words, the pulsed irradiation of the second contour vectors leads to significantly controlled input of energy into the powder since a molten pool diameter (cf. reference d below), and for example also a molten pool depth, become much smaller in pulsed operation than in continuous operation. Consequently, smaller melt patterns can be formed, which in particular for the first time allow irradiation of thin walls, for example with a wall thickness or structural thickness of less than 120 and 300 μm. The aforementioned wall thickness corresponds to about three times the extent of the beam offset during the surface irradiation (cf. reference v below).

For the described irradiation strategy, the device 50 comprises for example a pulse generator or pulse modulator 40. By means of the pulse modulator 40, which can advantageously be switched on and off in the beam path shown in FIG. 1, the same energy beam source (first energy beam source 20) may advantageously be used for the irradiation of the first contour vectors 1KV and the second contour vectors 2KV. A second energy beam source, for example a short-pulse laser, may thus advantageously be omitted.

Advantageously, the pulse modulator in the described device or production system 300 is configured to adjust an average laser power of between 200 and 400 W, a maximum laser power of between 100 and 1000 W, a pulse rate of between 1 and 50 Hz, for example 10 Hz or significantly higher, and a pulse duration in the millisecond range, for example between 1 and 100 ms.

According to an alternative configuration, the device 50 comprises a second energy beam source 20'. The second energy beam source 20' is advantageously configured for irradiation of the material layer of or for the component 10 according to pulsed or time-modulated irradiation operation (cf. second contour vectors 2KV). A second energy beam source 20' advantageously allows a larger bandwidth of the aforementioned parameters as well as more degrees of freedom for the temporal pulse modulation, in contrast to the use of the pulse modulator 40 mentioned above.

According to the invention described here (likewise cf. the figures described below, which relate to the selective irradiation method and to the computer program product), the component may for example—in comparison with a component produced according to the prior art—be produced with a surface quality or structural quality improved by 50 to 100% and/or a correspondingly improved dimensional accuracy.

Figure 2:
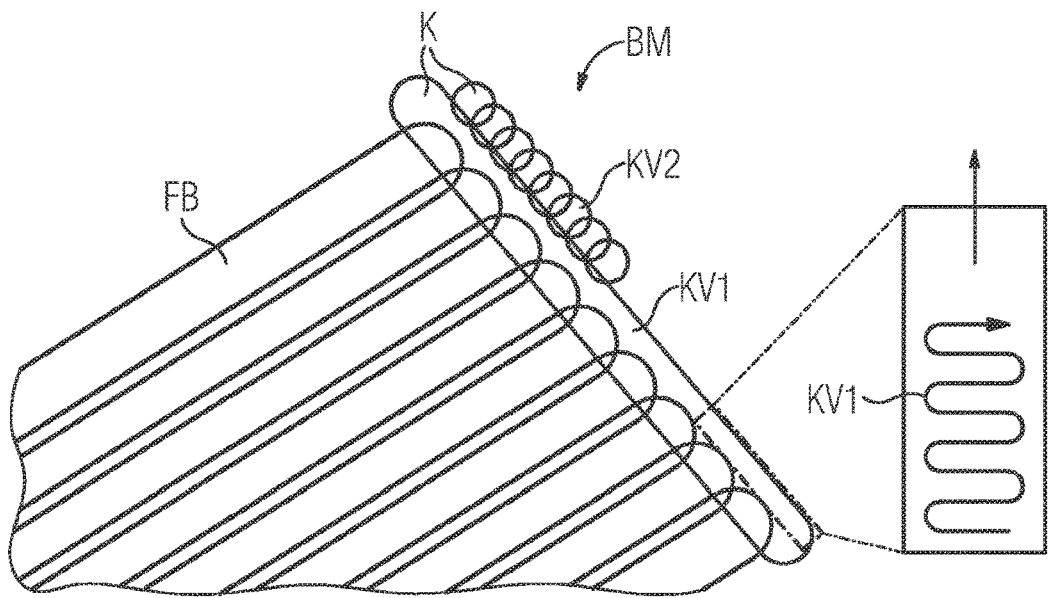
FIG. 2 shows a schematic view of an irradiation pattern according to the invention.

FIG. 2 shows a schematic top view, or view, of an irradiation pattern BM. The irradiation pattern BM comprises a surface region FB which—transferred to a physical material layer—corresponds for example to an inner-lying region of the component 10. The irradiation pattern BM furthermore comprises, as indicated above, a contour K comprising first contour irradiation vectors KV1 and second contour irradiation vectors KV2. The second contour vectors KV2 correspond, as indicated above, to irradiation paths which, for the production of the component, are applied after the first contour vectors KV1. Although the second contour vectors KV2, or the areas defined or covered by them (cf. FIG. 2), both relate to the contour K of the component, the vectors (first and second contour vectors KV1, KV2) need not necessarily be congruent. Accordingly, as represented in FIG. 2, the area of the second contour vectors may for example be smaller than the areas covered by the first contour vectors KV1, or may only partially overlap therewith.

The smaller areas of the second contour vectors KV2 indicate that the molten pool in the actual production of the component 10 also advantageously becomes smaller than that for the surface irradiation, or for the irradiation according to the first contour vectors KV1. Furthermore shown on the right in FIG. 2 is a typical meandering irradiation pattern according to which, for example, the surface regions FB or also the first contour vectors KV1 and/or KV2 are conventionally defined. Accordingly, for example, the hatching of the surface region as shown in FIG. 4 is merely a simplification.

The irradiation pattern BM is advantageously defined as a function of the overhang angle α of individual cross-sectional regions of the component 10. In other words, the overhang angles of individual regions of the component 10 are taken into account when establishing the irradiation pattern BM—for example by means of a corresponding algorithm or a computer program module.

Figure 4:
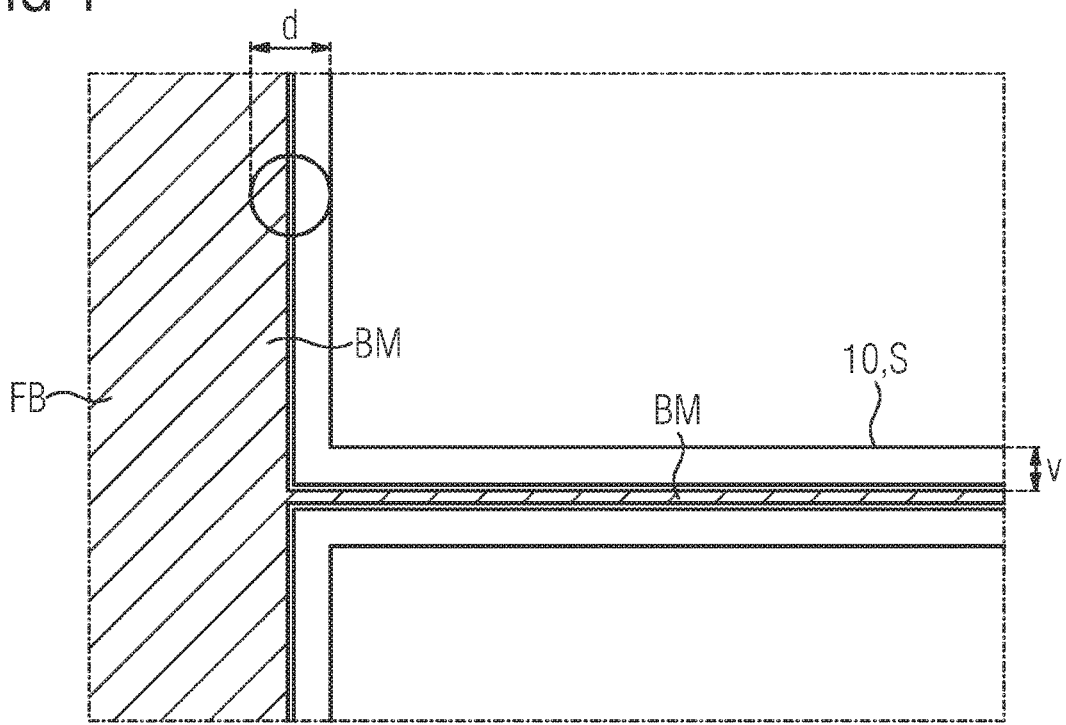
FIG. 4 schematically indicates the irradiation of a region of a component to be additively produced, according to the prior art.
Figure 5:
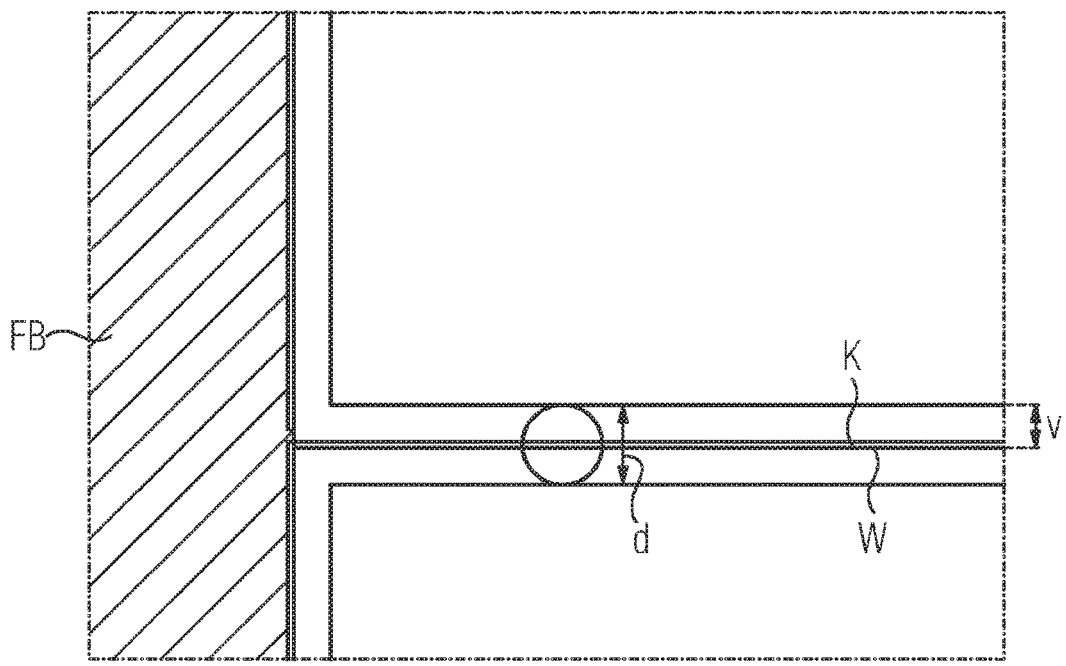
FIG. 5 schematically indicates the irradiation of a region of a component to be additively produced, according to the present invention.

Furthermore—for the definition of the irradiation pattern—advantageously (all) irradiation parameters relevant for the additive production process, such as vector length, pulse length, scan or irradiation speed, laser power, track or strip distance ("hatch" distance) and/or strip width, are correspondingly established or adapted (likewise cf. FIGS. 4 and 5).

By means of these parameters, for example, the radiation power or radiation energy introduced into the powder material and/or the solidified layer per time interval may also be accurately adjusted, calculated or simulated and in the scope of the described embodiment stored or linked in a data set (see below).

The first and/or second contour vectors KV1, KV2 of the contour K may, for example, have a length of between 50 and 200 μm. A scan speed may, as part of the irradiation parameters, furthermore be selected to be less than 200 mm/s, for example.

Figure 3:
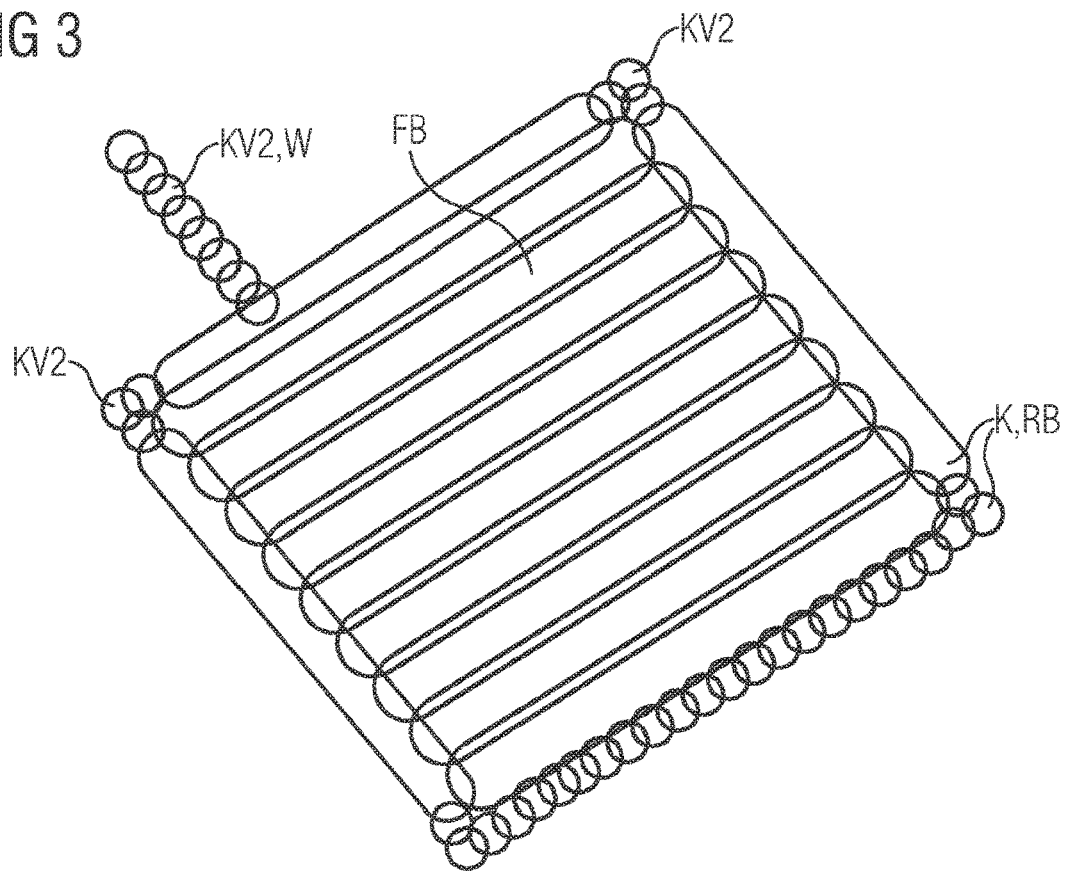
FIG. 3 shows a schematic view of an alternative irradiation pattern according to the invention.

FIG. 3 shows a similar image to FIG. 3, which indicates, with the reference KV2 for second contour vectors, regions of the component 10 that are particularly susceptible to structural defects during the additive production directly in the irradiation pattern BM. By the irradiation strategy proposed by the present invention, in particular the "pulsing" subsequent to the continuous irradiation operation and the inputs of heat which become correspondingly less during the irradiation according to the second contour vectors KV2, it is in particular possible to generate smaller melt patterns, which are for example particularly advantageous for the irradiation of thin walls and corners. Corners may in the present case, for example, be irradiated pointwise with pulsing of from 3 to 5 repetitions.

Specifically, according to the representation of FIG. 3, the corners of the component 10 or irradiation pattern BM as well as a thin wall of the component, shown at the top left, are irradiated according to the second contour vectors (exclusively pulsed). The irradiation of the wall may even be irradiated by means of only a single vector, for example with a wall thickness or structural thickness of less than 120 and 300 μm.

FIG. 4 schematically indicates the irradiation of a region of the component 10 to be additively produced.

In contrast to the representation of FIG. 3, not only the irradiation pattern BM but also at least one component layer 10, S, which is to be additively produced or is additively produced, is schematically indicated in FIG. 4. The represented region of the component layer together with the irradiation pattern BM in FIG. 4 corresponds approximately to the upper left region of FIG. 3, containing the second contour vectors for the described wall (cf. reference W below). The surface region FB, or its irradiation pattern BM, is shown on the left side in the image of FIG. 4. This inner region of the component is thus advantageously irradiated continuously according to the hatching FB shown. The hatching (in a simplified way) contains equidistantly extending, obliquely arranged irradiation vectors for time-efficient irradiation of the inner component regions. A molten pool diameter d is represented in the upper region of FIG. 4 as the width of the point (molten pool) represented. Although the representation of FIG. 4 is not true to scale, the molten pool, which is "moved" during the production of the component layer by the laser along the irradiation pattern, sweeps over at least sometimes equal areas in neighboring paths/vectors. In other words, regions of a previously solidified or swept region are usually melted again with a new vector.

Denoted with the reference W in the right region of FIG. 4 is a wall, which according to the prior art must likewise be provided with hatching (cf. reference BM). This type of irradiation, however, leads to an insufficient solidification or production outcome, in particular to excessive inputs of heat, which cause defects in the constructed structure of the wall or even distortions, which then lead to rejection of the component. A vertical beam offset is indicated by the reference v.

In contrast thereto, FIG. 5 shows a solution for irradiation of the wall W according to the present invention. It may for example be seen that, unlike in FIG. 4, hatching is no longer selected for the irradiation of the "wall"; rather now only a single (horizontal) vector with the molten pool diameter or energy beam diameter d indicated. By the irradiation strategy described here, the wall may advantageously be constructed to be thinner overall than is presently the case in the prior art (cf. FIG. 4). Furthermore, the temperature input into the powder subsequently forming the wall by the irradiation described here is less, and the wall W advantageously has a significantly improved dimensional accuracy as well as structural quality, for example fewer structural defects or crack centers. The irradiation of the wall W, which in FIG. 5 is shown by way of example with the aid of a single vertical irradiation vector, expediently corresponds to the contour irradiation according to the first and/or second contour vectors KV1, KV2.

Figure 6:
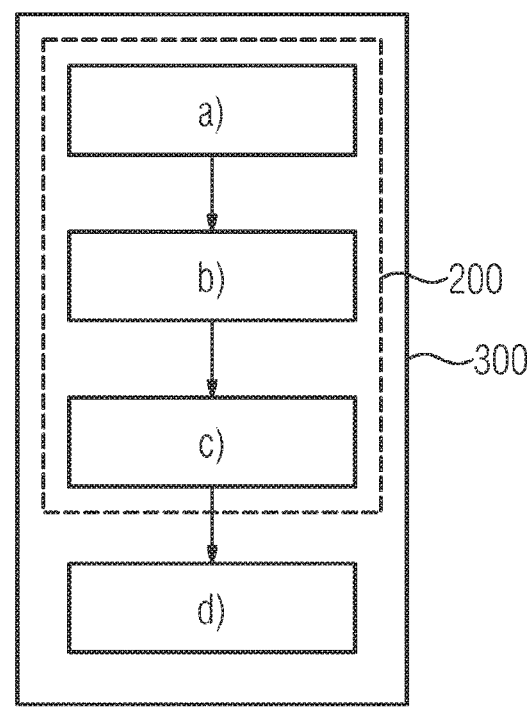
FIG. 6 shows a schematic flowchart which indicates method steps of the method according to the invention.

FIG. 6 indicates method steps according to the invention with the aid of a schematic flowchart. The method steps may, for example, be carried out by means of a data processing device or a computer 200 inside the production system 300 described above.

The method is advantageously a method for selectively irradiating a material layer S in additive production, comprising a) providing geometrical data comprising geometrical information of individual layers S of a component S to be additively produced, for example comprising uploading or downloading or otherwise reading in the data, and b) defining an irradiation pattern BM for the layers S by means of a computer-aided (CAM) manufacturing method (as described above), the irradiation pattern BM layerwise comprising a contour S and a surface region FB, for example lying inside the contour, and first contour vectors KV1 of the contour K for continuous irradiation operation and second contour vectors KV2 of the contour K for pulsed irradiation operation being established.

According to the present invention, information or data for the selective irradiation of the material layer, in particular irradiation parameters at least of the second contour vectors KV2 (but advantageously all irradiation parameters to be selected) are advantageously linked with geometrical data of the component 10, for example of a CAD file, together or in a common data set DS (cf. c)).

The data set DS may, for example, be an xml format, an amf file (.amf), or "G-Code" format or a comparable format or another CAM data set, which in addition to the geometrical information (CAD file) contains, for example, information about the selected irradiation parameters. By means of these parameters, for example, the radiation power or radiation energy per time interval introduced into the powder material and/or into the solidified layer may also be adjusted, calculated and, in the scope of the embodiment described, stored.

The data set DS may contain additionally material information of the component 10 and/or of a starting material therefor, this likewise being linked in the data set DS with the other information (cf. d)).

The irradiation pattern BM and/or the data set DS may, for example, be established and/or provided by a computer program product. The computer program product may for example also comprise instructions which, when the program is executed by a computer 200, cause the latter to carry out the layerwise establishment of the irradiation pattern BM and the linking of the information in the common data set DS, as described above.

The description with the aid of the exemplary embodiments does not restrict the invention to these exemplary embodiments; rather, the invention comprises any new feature and any combination of features. This includes in particular any combination of features in the patent claims, even if this feature or this combination per se is not specifically indicated in the patent claims or exemplary embodiments.

The invention claimed is:

1. A method for selectively irradiating at least one material layer in additive production, the method comprising:
 providing geometrical data comprising geometrical information of any one of the of the material layers of a component to be additively produced,
 defining an irradiation pattern for any one of the material layers by means of a computer-aided manufacturing method, the irradiation pattern layerwise comprising a contour and a surface region of the component,
 wherein first contour vectors of the contour for continuous irradiation operation and second contour vectors of the contour for pulsed irradiation operation are established, and
 wherein the first contour vectors continuously irradiate a first portion of the surface region of the component, and independently the second contour vectors pulse irradiate a second portion of the surface region of the component,
 wherein further irradiation parameters for the irradiation pattern comprising vector length, pulse length, scan or irradiation speed, laser power, track or strip distance and/or strip width are established,
 wherein anyone of the material layers of the component is manufactured using the irradiation pattern,
 wherein the first contour vectors of contour are irradiated before the second contour vectors of contour.

2. The method as claimed in claim 1,
 wherein the contour comprises regions of the component having a defined surface quality or structural quality and/or a defined dimensional accuracy.

3. The method as claimed in claim 1,
wherein the irradiation pattern is defined as a function of an overhang angle of individual cross-sectional regions of the component.

4. The method as claimed in claim 1,
wherein a vector length of the first and/or second contour vectors of the contour has a length of between 50 and 200 pm, and wherein the irradiation parameters comprise a scan speed of less than 200 mm/s.

5. A method for providing a data set for the selective irradiation of a material layer claimed in claim 1, further comprising:
linking irradiation parameters at least of the second contour vectors with the geometrical data in a common data set.

6. The method as claimed in claim 5,
wherein the data set additionally contains material information of the component and/or of a starting material therefor, and wherein this is likewise linked in the data set.

7. A device for selectively irradiating a material layer in additive production, adapted for carrying out a method as claimed in claim 1, comprising:
an energy beam source for selectively irradiating a material layer,
wherein the device is configured to allow continuous as well as pulsed irradiation operation.

8. The device as claimed in claim 7, further comprising: a pulse generator.

9. The device as claimed in claim 7,
wherein the energy beam source is a first energy beam source for continuous irradiation operation, and wherein the device comprises at least one second energy beam source for pulsed irradiation operation of the contour.

10. An additive production method comprising:
the method selectively irradiating a material layer as claimed in claim 1,
wherein the selective irradiation is carried out by means of a laser or an electron beam, and the material layer is a powder layer.

11. The additive production method as claimed in claim 10,
wherein the powder layer is a hardened nickel-based or cobalt-based superalloy, and
wherein the component is a component part which is to be used in the hot-gas path of a turbomachine.

12. The component which is produced or producible as claimed in claim 10, furthermore comprising:
in comparison with a prior art component produced according to the prior art, a surface quality or structural quality and/or dimensional accuracy improved by 50 to 100%.

13. A computer program product stored on a non-transitory computer readable media comprising:
instructions which, when the program is executed by a computer, cause the computer to carry out the layerwise establishment of the irradiation pattern as claimed in claim 1.

14. The computer program product of claim 13, further comprising:
instructions which, when the program is executed by a computer, cause the computer to carry out linking of irradiation parameters at least of the second contour vectors with the geometrical data in a common data set.

* * * * *